(12) United States Patent
Ishikura et al.

(10) Patent No.: US 7,732,997 B2
(45) Date of Patent: Jun. 8, 2010

(54) PIEZOELECTRIC ELEMENT AND MANUFACTURING METHOD THEREOF, ELECTRONIC DEVICE, INK JET DEVICE

(75) Inventors: Junri Ishikura, Tokyo (JP); Naoari Shibata, Kawaguchi (JP); Katsumi Aoki, Yokohama (JP); Yasuyuki Saito, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 383 days.

(21) Appl. No.: 11/723,224

(22) Filed: Mar. 19, 2007

(65) Prior Publication Data

US 2007/0228894 A1  Oct. 4, 2007

(30) Foreign Application Priority Data

Apr. 3, 2006 (JP) ............... 2006-101451
Mar. 2, 2007 (JP) ............... 2007-052325

(51) Int. Cl.
*H01L 41/047* (2006.01)
(52) U.S. Cl. .................. 310/363; 310/364; 310/365
(58) Field of Classification Search .............. 310/363, 310/364
See application file for complete search history.

(56) References Cited

U.S. PATENT DOCUMENTS 6,783,800 B2  8/2004  Saito et al. ................. 427/201
7,262,544 B2  8/2007  Aoki et al.
2002/0097305 A1*  7/2002  Sumi ........................... 347/68
2002/0140320 A1* 10/2002  Unno et al. .................. 310/328
2005/0213020 A1*  9/2005  Takeda et al. ............... 349/182
2005/0218488 A1* 10/2005  Matsuo ....................... 257/678

FOREIGN PATENT DOCUMENTS

| CN | 1636729 | 7/2005 |
|---|---|---|
| JP | 8-274573 | 10/1996 |
| JP | 2000-328223 | 11/2000 |
| JP | 2001-152360 | 6/2001 |
| JP | 2002-16229 | 1/2002 |

OTHER PUBLICATIONS

Official Action dated Jan. 16, 2009 in Chinese Application No. 200710091634.2.

* cited by examiner

*Primary Examiner*—Walter Benson
*Assistant Examiner*—Derek J Rosenau
(74) *Attorney, Agent, or Firm*—Fitzpatrick, Cella, Harper & Scinto

(57) ABSTRACT

Providing a manufacturing method of a piezoelectric element by which even if an electrode and a piezoelectric film stacked on a substrate are baked at a high temperature, the electrode does not oxidize and mutual diffusion between the substrate, the electrode and the piezoelectric film may be suppressed. The electrode is adapted as a laminated layer body which includes an electroconductive oxide layer, a mixture layer having an electroconductive oxide and electroconductive metal, and an electroconductive metal layer including the electroconductive metal from a substrate side, and the mixture layer above is adapted as a graded composition structure in which a ration of the electroconductive oxide is highest in an interface with the electroconductive oxide layer and lowest in an interface with the electroconductive metal layer.

12 Claims, 3 Drawing Sheets

PIEZOELECTRIC ELEMENT AND MANUFACTURING METHOD THEREOF, ELECTRONIC DEVICE, INK JET DEVICE

BACKGROUND OF THE INVENTION

1. Field of the Invention

The present invention relates to a piezoelectric element and a manufacturing method thereof, further to an electronic device and an ink jet device including the relevant piezoelectric element.

2. Description of the Related Art

A piezoelectric element exhibits the piezoelectric effect, which produces an electric field due to a strain, and the inverse piezoelectric effect, which produces a strain due to an applied electric field. A piezoelectric element which is mainly formed of lead zirconate titanate (hereinafter, called "PZT") with addition of an extremely small amount of an element such as represented by strontium, barium or niobium is used as a piezoelectric film.

Conventionally, production of a piezoelectric element has included: mixing a raw material powder for a piezoelectric film, pressurizing the raw material powder to sinter it, machining the sintered material to form a piezoelectric film, and subsequently holding the piezoelectric film between electrode materials to polarize the piezoelectric film, thereby producing piezoelectricity. However, recently, as a device becomes miniaturized, it becomes necessary to mount a piezoelectric element on a thinner, smaller area. A piezoelectric element of an oxide-based substance represented by PZT is a brittle material, and therefore it has a machining limit to be thinned up to about 0.1 mm, so that it can be made thin only up to about 0.1 mm. Further, an effect exerted by an adhesive is not negligible in a high frequency band. Therefore, in order to produce a thinner piezoelectric element without a bonding process, various film formation methods such as a sputter method, a CVD method, an aerosol deposition method, a hydrothermal synthesis method and a sol-gel method, etc. have been devised and a piezoelectric element has been manufactured by way of trial using such a method.

Particularly, the aerosol deposition method has a high rate of film formation and recently, particularly attracts attention as a film formation method. FIG. 1 illustrates a rough outline of an aerosol deposition device. This method is that, first, gas 6 such as air, etc. is supplied into an aerosol formation chamber 1 having material particles such as PZT, etc. put therein, and the material particles are aerosolized. Then, the aerosolized particles are directed to a film formation chamber (film forming chamber) 2 connected by a carrier pipe 3, by a differential pressure between both chambers, the material particles are squirted from a nozzle 4 provided on a front edge of the carrier pipe 3 to a substrate 8 on a stage 5, forming a film on the substrate 8, and an air within the film forming chamber is exhausted by vacuum pump 7.

In addition, there is an ink jet device as one of electronic devices using a piezoelectric element. The piezoelectric element may be used for an ink jet head of the ink jet device. In the ink jet device using the piezoelectric element, a system is known that a pressure is generated by applying a voltage to a pressure generator using the piezoelectric element to discharge ink. The ink jet device of this system includes a pressure generator having laminated layers of a pressure generation member of PZT (lead zirconate titanate) etc., a metal plate and ceramics, ink as a flying medium and a nozzle plate having a ink discharge hole. In the ink jet device having such a pressure generator, heads of various types such as a type using a bending mode called "Kyzer type", a direct pressing type called "piston type" and a type using a shear mode in which a side wall is moved are manufactured in the market.

When a thin film piezoelectric element is formed, there is a method by which, first, a lower electrode is formed on a substrate and next a piezoelectric film is formed by various film formation methods. Subsequently, processes such as a baking process, a formation process of an upper electrode and a polarization process are carried out. To provide a sufficient piezoelectric performance, a baking process at several hundred degrees Celsius is necessary after film formation of the piezoelectric film. This baking process can facilitate enlargement of a crystal grain size and improvement of crystallization, providing a higher piezoelectric performance. In addition, the higher the baking temperature is, the higher piezoelectric performance tends to develop.

However, baking may present a problem that mutual diffusion among a substrate, an electrode and a piezoelectric film occurs. Specifically, as described in Japanese Patent Application Laid-Open No. H08-274573, when a Si wafer is used as a substrate, Ti and Pt are used as an electrode, and a piezoelectric film is formed of PZT, then Si, Ti and Pt diffuse into the PZT film and Pb diffuses into the Si wafer, though there is difference in the degree of diffusion depending on a baking temperature. As described above, if diffusion occurs, a Pt component drops out of the PZT film and further impurities get into the PZT, which presents a problem that electric characteristics may not be enhanced sufficiently. Also, when Pb diffuses into the Si wafer, the Si wafer gets hardened, causing a problem that accurate machining may not be allowed when the machining is required in a post-process after film formation. Particularly, when an ink jet head is formed, the backside of a Si wafer on which a piezoelectric film is formed is often cut to form a flow path, and at this time, machining is difficult due to diffusion of the Pb component into the Si wafer.

Moreover, diffusion of a material for a lower electrode into PZT progresses, a part of the material reaches the upper portion of the PZT film, and then the PZT film may not often function as a piezoelectric element because of contacting electrically with an upper electrode formed after baking. As a film thickness of the PZT film becomes thinner, this tendency appears more prominently.

Further, there is a problem that a higher baking temperature oxidizes an electrode itself to provide resistance, so that the electrode may not work as an electrode. For example, to provide adherence between a substrate and Pt, use of Ta, etc. as an adhesion layer has an effect of adherence (see Japanese Patent Application Laid-Open No. 2001-152360), but tantalum oxide may be created even at a comparatively low temperature of about 600° C. Also, it is proposed that an electroconductive oxide film represented by $SrRuO_3$ be used as an electrode (see Japanese Patent Application Laid-Open No. 2000-328223 and Japanese Patent Application Laid-Open No. 2002-016229), but specific resistance starts to increase at about 700° C., then, beyond 800° C., the electrode becomes approximately similar to an insulating film, so not preferable for an electrode.

SUMMARY OF THE INVENTION

An object of the present invention is to provide a manufacturing method of a piezoelectric element by which, even if an electrode and a piezoelectric film laminated on a substrate are baked together at a high temperature, the electrode is not oxidized and mutual diffusion among the substrate, the electrode and the piezoelectric film is suppressed. Further, another object is to provide an electronic device and an ink jet device having a piezoelectric element which secures high adherence between each of layers and further has a better piezoelectric performance owing to the relevant method.

A first embodiment of the present invention is a piezoelectric element which includes at least a substrate, a piezoelectric film and an electrode disposed between the substrate and the piezoelectric film, wherein the electrode includes an electroconductive oxide and electroconductive metal, and, on the substrate side in the electrode, the electroconductive oxide is contained more than the electroconductive metal, and further, on the piezoelectric film side in the electrode, the electroconductive oxide is contained less than the electroconductive metal. Further, in this embodiment, the electrode above includes an electroconductive oxide layer situated on the substrate side, an electroconductive metal layer including electroconductive metal situated on the piezoelectric film side, and a mixture layer provided between the electroconductive oxide layer and the electroconductive metal layer and formed by mixing the electroconductive oxide and the electroconductive metal.

Moreover, a second embodiment of the present invention is a manufacturing method of a piezoelectric element which includes at least a substrate, a piezoelectric film and an electrode disposed between the substrate and the piezoelectric film, wherein the method includes providing an electrode on a substrate and baking a piezoelectric film after forming the piezoelectric film on the electrode, wherein the electrode is adapted so that, on the substrate side, the electroconductive oxide is contained more than the electroconductive metal and, on the piezoelectric film side in the electrode, the electroconductive oxide is contained less than the electroconductive metal. Further, in this embodiment, the electrode above is formed on the substrate by providing, on the substrate, an electroconductive oxide layer, a mixture layer formed by mixing an electroconductive oxide and electroconductive metal situated on the electroconductive oxide layer, and an electroconductive metal layer situated on the mixture layer.

Further, the present invention provides an electronic device and an ink jet device using the piezoelectric element of the present invention above.

According to the present invention, an electrode configuration between a substrate and a piezoelectric film is adapted as a laminated configuration including an electroconductive oxide layer, a mixture layer of an electroconductive oxide and electroconductive metal, and an electroconductive metal layer, so that high adherence in each of interfaces between the substrate and the electrode and between the electrode and the piezoelectric film can be provided. Further, mutual diffusion of elements between each of layers can be suppressed at the time of baking of the piezoelectric film. As the result, baking at a higher temperature can be practiced, providing a piezoelectric element of which electric characteristics for a piezoelectric film is sufficiently brought out. Further features of the present invention will become apparent from the following description of exemplary embodiments (with reference to the attached drawings).

Further features of the present invention will become apparent from the following description of exemplary embodiments with reference to the attached drawings.

DESCRIPTION OF THE EMBODIMENTS

Figure 1:
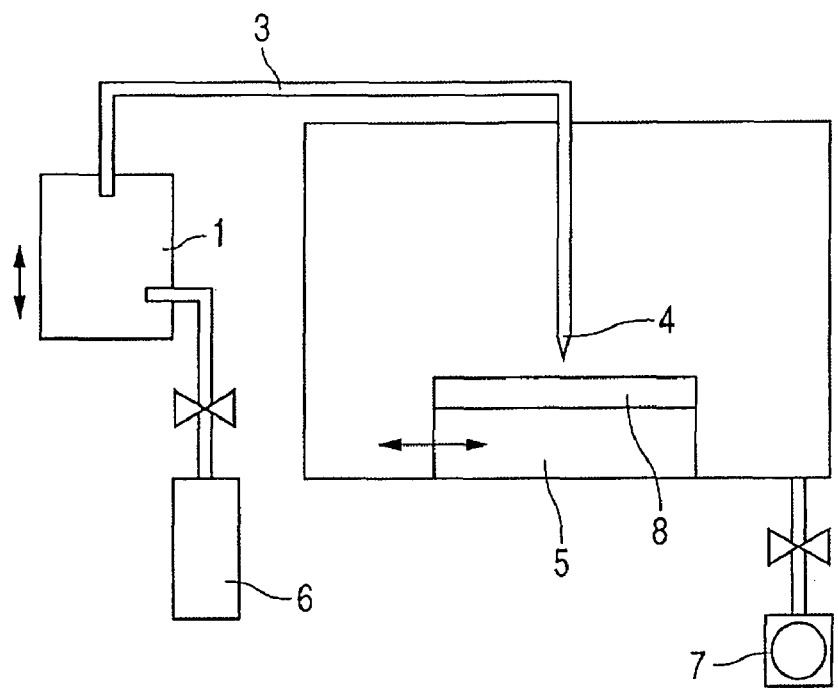
FIG. 1 illustrates a rough outline of an aerosol deposition device used in a manufacturing method of the present invention.

A piezoelectric element of the present invention is such that an electrode provided between a substrate and a piezoelectric film is adapted as a laminated layer body including an electroconductive oxide layer (first layer), a mixture layer (second layer) having an electroconductive oxide and electroconductive metal (metal) and an electroconductive metal layer (third layer). Then, the piezoelectric element may be preferably adapted so that the electroconductive oxide is a main component on the substrate side (the electroconductive oxide layer side) of the mixture layer (second layer), the metal is a main component on the piezoelectric film side (the electroconductive metal layer side) of the mixture layer (second layer), and concentration of the electroconductive oxide becomes lower as getting near to the piezoelectric film side from the substrate side of the electrode (concentration of the metal becomes lower as getting near to the substrate side from the piezoelectric film side).

In addition, in the present invention, a boundary between the first layer, the second layer and the third layer may be defined indistinctly. That is, for example, the electrode may include one layer without a distinctly defined boundary and it has concentration gradients (slopes) of the electroconductive oxide and the metal along the thickness direction thereof.

A specific example of this configuration, for example, may be preferably such that an electrode includes at least an electroconductive oxide and metal, the electroconductive oxide is a main component on the substrate side of the electrode, and the metal is a main component on the piezoelectric film side of the electrode, and further concentration of the electroconductive oxide becomes lower as getting near to the piezoelectric film side from the substrate side of the electrode (concentration of the metal becomes lower as getting near to the substrate side from the piezoelectric film side). This configuration may be more preferably such that the electrode includes only the electroconductive oxide on the substrate side of the electrode and only the metal on the piezoelectric film side of the electrode. An embodiment will be mainly described hereinafter in which an electrode includes a laminated layer body including an electroconductive oxide layer, a mixture layer having an electroconductive oxide and electroconductive metal (metal), and an electroconductive metal layer (metal layer), but, as described above, an electrode configuration according to present invention is not limited to this embodiment. That is, a case where a boundary between each of layers constituting an electrode may not be defined substantially, or an electrodes includes one layer having a concentration gradient described above may fall within the present invention.

In the present invention, glass, a Si wafer, a Si wafer having an oxidized substance layer such as $SiO_2$ on its surface and the like may be preferably used as a substrate. The substrate particularly preferably includes silicon oxide on its surface.

The Si wafer above, also, may include silicon oxide on its surface due to natural oxidation or positive oxidation.

As an electroconductive oxide used for the present invention, at least one type selected from the group including $LaNiO_3$, $LaCrO_3$, $SrRuO_3$, $CaRuO_3$, $La_{1-x}Sr_xCoO_3$, $BaPbO_3$, $La_{1-x}Sr_xCa_xRuO_3$, $La_{1-x}Sr_xTiO_3$ and $SrIrO_3$ especially shown by the $ABO_3$ perovskite type, and compounds thereof may be preferably used. These materials may have better adherence to a substrate having an oxidized substance such as silicon oxide (usually, $SiO_2$) on the surface thereof. Further, these electroconductive oxides have an effect to suppress diffusion of elements due to baking. A thickness of those electroconductive oxide layers may be preferably not smaller than 0.1 μm and not larger than 10 μm to achieve the effect of diffusion suppression described above.

In addition, Pt-group (Ru, Rh, Pd, Os, Ir, and Pt) may be preferably used as electroconductive metal (metal) because of better adherence to a piezoelectric film of PZT, etc. Moreover, the Pt-group scarcely oxidizes or gets insulated even at the time of baking at about 900° C. Pt may be more preferably used. A practical thickness of those electroconductive metal layers may be preferably not smaller than 0.1 μm and not larger than 10 μm.

In the present invention, between the electroconductive oxide layer (first layer) and the electroconductive metal layer (third layer) above, the mixture layer (second layer) including the same electroconductive oxide as that constituting the first layer and the same metal as that constituting the third layer are provided. According to this configuration, adherence between the electroconductive oxide layer and the electroconductive metal layer can be enhanced. Particularly, the mixture layer is adapted as a gradient structure (graded layer) in which composition thereof is changed in the film thickness direction (the direction in which the first layer and the third layer are opposing to each other), which can further enhance the adherence between the first layer and the third layer described above. Specifically, in the mixture layer (second layer), concentration of the electroconductive oxide is made highest in an interface with the electroconductive oxide layer and is gradually reduced toward an interface with the electroconductive metal layer. A film thickness of such a mixture layer may be made not smaller than 10 nm and not larger than 1 μm, suppressing peel and providing strong adherence.

For a forming method of the mixture layer above, a method may be preferably used by which a plurality of targets is forced to discharge concurrently by a sputter method.

In the present invention, particularly, a PZT-based oxide or a relaxor-based dielectric material may be quoted for the piezoelectric film provided on the electrode above. Among them, in the case of the PZT-based oxide, an oxide indicated by $Pb(Zr_y, Ti_{1-y})O_3$, where y is in the range of 0.2 to 0.8, may be preferable. Further, in the case of the relaxor-based dielectric material, at least one type selected from the group including $Pb(Mn, Nb)O_3$—$PbTiO_3$, $Pb(Zn, Nb)O_3$—$PbTiO_3$, $Pb(Sc, Ta)O_3$—$PbTiO_3$, $Pb(In, Nb)O_3$—$PbTiO_3$, $Pb(Yb, Nb)O_3$—$PbTiO_3$, $Pb(Ni, Nb)O_3$—$PbTiO_3$, and compounds thereof may be suitable.

A practical thickness of the piezoelectric film above may be preferably not smaller than 1 μm and not larger than 200 μm.

In addition, for a film formation method of the piezoelectric film above, a gas deposition method, a sputter method, a sol-gel method and a CVD method etc. may be preferably used.

The piezoelectric element of the present invention may be formed for providing a piezoelectric film having excellent electric characteristics, by forming an electroconductive oxide layer, a mixture layer and an electroconductive metal layer as an electrode on a substrate, subsequently forming a piezoelectric film, then applying a baking process. Usually, the electrode above may be a lower electrode, and further an upper electrode is formed on the piezoelectric film above, providing a piezoelectric element.

Example

A Si wafer was used as a substrate 8 and a lower electrode was formed as follows.

Figure 2:
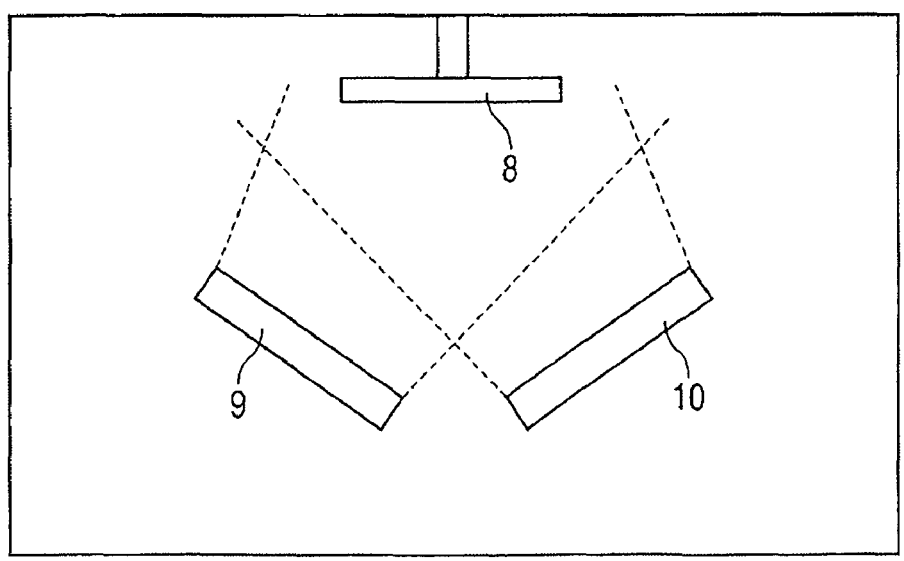
FIG. 2 is a schematic depiction illustrating the inside of a chamber of a sputter device used in an example of the present invention.

First, a $SrRuO_3$ film was formed with a thickness of 300 nm on the substrate 8 by a magnetron sputter method. Next, a mixture layer having $SrRuO_3$ and Pt was formed with a thickness of about 300 nm. Further, a Pt layer was formed with a thickness of 300 nm. The mixture layer was adapted to have a graded composition structure in which a ratio of Pt was increased gradually from the $SrRuO_3$ layer to the Pt layer. The gradient layer (mixture layer), as shown in FIG. 2, was adapted in a manner that two targets 9, 10 having their own materials were forced to discharge concurrently and composition of the gradient layer formed on the substrate 8 was adjusted by controlling power applied to each of the targets. Specifically, the power of the $SrRuO_3$ target 10 was maximized at the start of formation of the mixture layer and then reduced gradually to zero at the end of formation of the mixture layer. The power of the Pt target 9, adversely, was set to zero at the start of formation of the mixture layer and then increased gradually to a maximal value at the end of formation of the mixture layer.

For comparison, a lower electrode was manufactured in a configuration in which Ta and Pt were set to 50 nm and 850 nm respectively from the substrate 8, and also a thickness was made totally equal.

Then, on the lower electrode formed in such a way, a PZT film was formed with a thickness of about 3 to 5 μm by an aerosol deposition method using the device shown in FIG. 1.

Conditions for film formation by the aerosol deposition method at this time are as follows.

Material used: PZT-LQ from SAKAI CHEMICAL INDUSTRY CO., LTD.
Initial particle size: 0.2 to 0.5 μm
Temperature at film formation: room temperature
Air flow into the aerosol formation chamber: 4 cc/min
Differential pressure between both chambers: about 67 kPa Next, this PZT film was ground to a film thickness of 3±0.1 μm by a grinder and uniformity of in-plane distribution was improved, providing a piezoelectric film.

Next, the substrate 8 having up to this piezoelectric film formed thereon along with fine particles for raw material was put in a container of zirconia, and all even with the container were baked at 900° C. in an electric furnace. Putting in the fine particles for raw material together is because Pb is prevented from dropping out due to baking and further a portion from which Pb drops is compensated for.

A rate of raising and lowering temperature was set to 2° C./min and baking was held at 900° C. for one hour.

After baking, an upper electrode was provided by forming Ta of 50 nm and Pt of 150 nm on the PZT film by a magnetron sputter method.

The piezoelectric element formed in such a way was measured for a dielectric constant and an equivalent piezoelectric constant (d31) as electric characteristics. A variable used for computation of the piezoelectric constant was measured with applying a voltage to a sample which was formed by cutting off the piezoelectric element above in form of cantilever. Further, Young's moduli of both the substrate and the piezoelectric film were derived from measurement by a nanoindenter. Moreover, a diffusion sate was estimated by examining each component of the electrode, the piezoelectric film and the substrate by using SIMS.

Each of the results was shown in Table 1.

The comparative sample was not able to be measured for electric characteristics, because the lower electrode diffused into the surface of the piezoelectric film due to baking after formation of the piezoelectric film, and accordingly leakage between the lower and upper electrode occurred due to film formation of the upper electrode. Further, also in analysis of the depth direction by SIMS, it was observed that Ta diffused up to the surface of the piezoelectric film and further Pb diffused into the Si wafer of the substrate.

On the contrary, in the electrode configuration of the present invention, high values of the dielectric constant and d31 for electric characteristics were exhibited. Further, from analysis of the diffusion state in the depth direction by SIMS (Secondary Ion Mass Spectrometry), it was found that components of the electrode did not diffuse into PZT, and only Pb of components of PZT diffused into the electrode, but it did not reach the substrate 8.

TABLE 1

| Estimation items | PZT/Pt/Pt-SrRuO₃ graded film/SrRuO₃/substrate | PZT/Pt/Ta/substrate |
|---|---|---|
| Dielectric constant | 2100 | not measurable |
| d31 | 99 pC/N | not measurable |
| Diffusion state | Pb diffusion partway to the electrode is confirmed Pb diffusion to the substrate is not observed Diffusion of the electrode layer into PZT is not observed | Pb diffusion to the substrate is confirmed Ta diffusion to PZT is confirmed |

Figure 3:
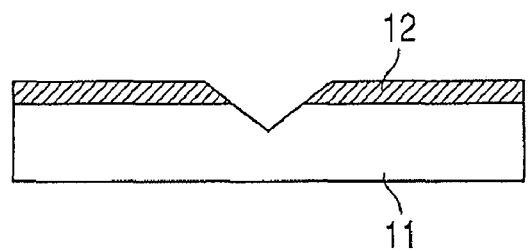
FIG. 3 is a schematic depiction illustrating a section of a sample used for tape peel test carried out in an example of the present invention.

Next, to confirm adherence between each of the layers, tape peel test was carried out on the lower electrodes of two type configurations described below in which a film thickness of the mixture layer was made different. One of the two type configurations was that on a Si wafer for a substrate 8, SrRuO₃ as an electroconductive oxide layer, next a mixture layer having a composition ratio of SrRuO₃ and Pt which has a gradient in the film thickness direction, and next Pt as an electroconductive metal layer were stacked in this order. The other configuration was that on a Si wafer for a substrate 8, SrRuO₃ as an electroconductive oxide layer, next a mixture layer having a composition ratio of SrRuO₃ and Ir which has a gradient in the film thickness direction, and next Ir as an electroconductive metal layer were stacked in this order. These lower electrodes having different thicknesses of the mixture layers were tested for adherence using a tape. This was carried out using a method by which, after the lower electrode was formed on the Si wafer for the substrate 8, notches in form of 25 grids with a size of 5 mm×5 mm were cut in the relevant lower electrode in a dicing process, and a mending tape was bonded to the lower electrode having the notches cut therein, and then the number of pieces which peeled was estimated. FIG. 3 is a schematic depiction illustrating a section of the lower electrode cut in form of grid. As shown in FIG. 3, the relevant lower electrode 12 was cut up to a substrate 11 to cut completely.

A film thickness of SrRuO₃ was set to 100 nm, film thicknesses of Pt layer and Ir layer were set to 100 nm and a film thickness of a mixture layer having a gradient was changed from 0 to 10 μm, and thus estimation was carried out. In addition, the thickness of the mixture layer was adjusted by controlling duration of sputter discharge time. The result of the tape peel test on the electrode is shown in Table 2.

TABLE 2

| | | Thickness of the mixture layer | | | | | | |
|---|---|---|---|---|---|---|---|---|
| | | 0 nm | 5 nm | 10 nm | 100 nm | 1 μm | 2 μm | 10 μm |
| Tape test (the number of pieces which peeled/total 25) | Pt—SrRuO₃ | 25 | 12 | 0 | 0 | 0 | 5 | 7 |
| | Ir—SrRuO₃ | 25 | 8 | 0 | 0 | 0 | 2 | 3 |

Even in either case, adherence between each of the layers was insufficient when the thickness of the mixture layer was not greater than 5 nm, and particularly, and when the mixture layer was absent, the electroconductive oxide layer peeled completely from the electroconductive metal layer. Strong adherence without peel was able to be provided when the thickness of the mixture layer was not smaller than 10 nm and not larger than 1 μm.

Example 2

An ink jet head was formed by forming a piezoelectric element on a vibrating plate including a Si substrate, next forming a flow path in a FIB process and finally bonding an orifice plate having a discharge hole. Formation processes will be described with reference to FIGS. 4A, 4B, 4C, 4D, 5A, 5B, 5C and 5D.

Figure 4A:
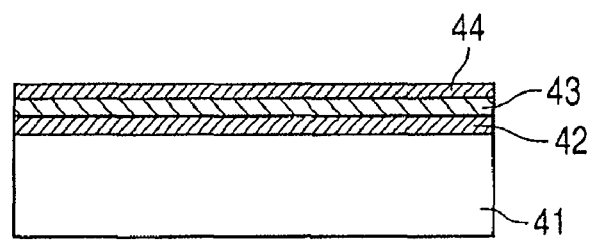
FIGS. 4A, 4B, 4C and 4D illustrate manufacturing processes of a piezoelectric element in an example of the present invention.

First, similar to the example 1, SrRuO₃ of 300 nm constituting an electroconductive oxide layer, a mixture layer of 300 nm having a composition ratio of SrRuO₃ and Pt which has a gradient in the film thickness direction, and Pt of 300 nm constituting an electroconductive metal layer were formed in this order by a magnetron sputter method on a vibrating plate (substrate) 41 including quartz glass as a lower electrode 42. Next, by the aerosol deposition method shown in FIG. 1, a PZT film constituting a piezoelectric film 43 having a thickness of about 5 μm was formed entirely on the substrate 41 (on the electroconductive oxide layer). Next, baking was carried out in atmospheric air at 900° C. for one hour. A raising and lowering rate of temperature was set to 2° C./min. Subsequently, Ti of 40 nm, Pt of 160 nm for an upper electrode 44 were formed (FIG. 4A).

Figure 4B:
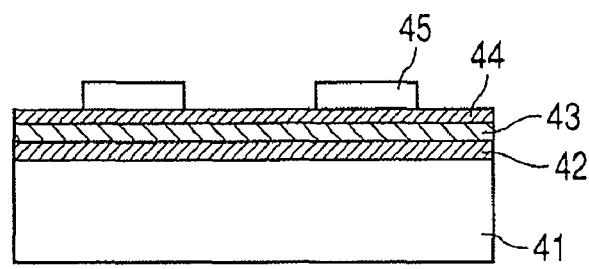
Figure 4C:
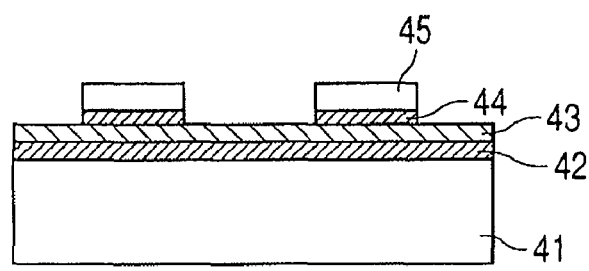
Figure 4D:
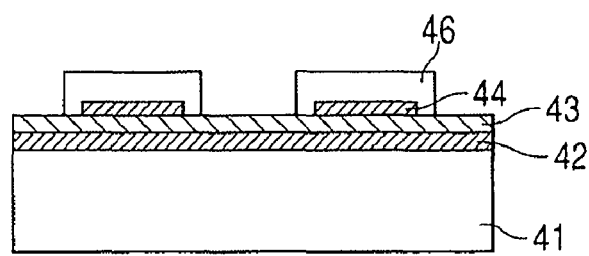
Figure 5A:
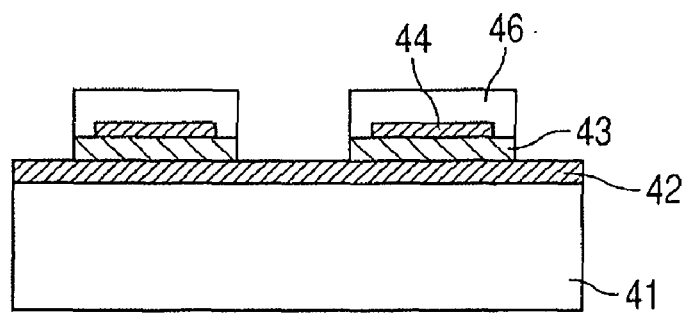
FIGS. 5A, 5B, 5C and 5D illustrate manufacturing processes of a piezoelectric element in an example of the present invention.
Figure 5B:
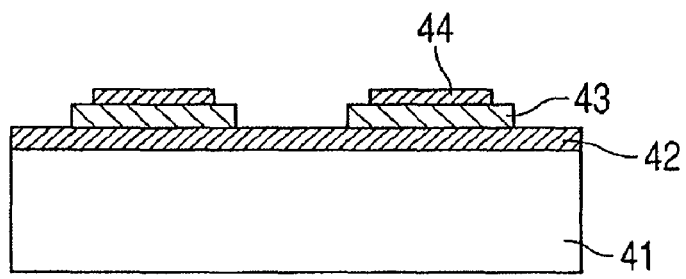
Figure 5C:
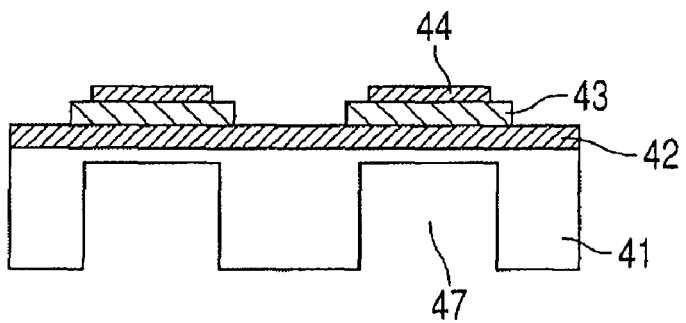
Figure 5D:
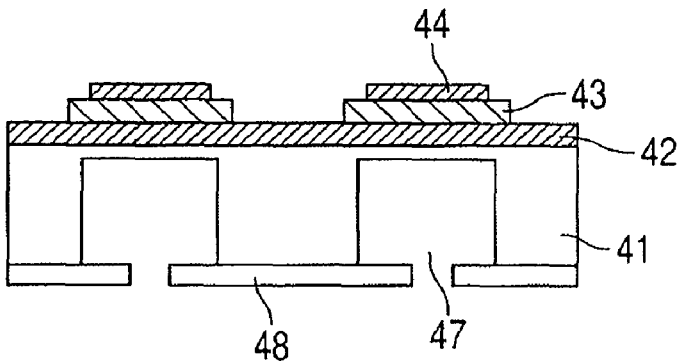

Next, positive resist was applied to etch the upper electrode 44, forming a resist pattern 45 (FIG. 4B). Next, by RIE (Reactive Ion Etching), Pt and Ti exposed on the upper electrode 44 were etched (FIG. 4C). Next, the resist for the upper electrode was removed and resist 46 for PZT was patterned to surround the upper electrode 44 (FIG. 4D). In this situation, a PZT film was etched using fluoric nitric acid (FIG. 5A), subsequently the resist was removed (FIG. 5B). Next, a flow path 47 was formed in a FIB process (FIG. 5C). After cleaning, the Si substrate with a discharge hole as an orifice plate 48 was bonded, and finally, the substrate 41 was cut to provide an ink jet head (FIG. 5D).

In this example, $SrRuO_3$ was used as an electroconductive oxide and lead zirconate titanate (PZT) was used as a piezoelectric film, but not limited to these.

Further, in this example, the PZT film was patterned as described above, but when the PZT film was formed by the aerosol deposition method, a patterning method may be used by which a mask having an opening was inserted between a nozzle and the substrate. Moreover, also for formation of the PZT film, any of a sputter method, a sol-gel method, a CVD method and the like may be used. The piezoelectric element of the present invention may be applied to an electronic device using a heretofore known piezoelectric element. The electronic device may include a wide range of devices, for example, a piezoelectric actuator, a pressure sensor or an ink jet device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2006-101451, filed Apr. 3, 2006, and 2007-052325, filed Mar. 2, 2007, which are hereby incorporated by reference herein in their entirety.

What is claimed is:

1. A piezoelectric element, comprising:
    at least a substrate, a piezoelectric film and an electrode disposed between the substrate and the piezoelectric film, wherein
    the electrode includes an electroconductive oxide and an electroconductive metal,
    the electroconductive oxide is contained more than the electroconductive metal on the substrate side in the electrode,
    the electroconductive metal is contained more than the electroconductive oxide on the piezoelectric film side in the electrode,
    the electrode includes an electroconductive oxide layer situated on the substrate side, an electroconductive metal layer including the electroconductive metal situated on the piezoelectric film side and a mixture layer provided between the electroconductive oxide layer and the electroconductive metal layer and having the electroconductive oxide and the electroconductive metal mixed therein, and
    the piezoelectric element comprises a graded composition structure in which a ratio of the electroconductive oxide in the mixture layer is reduced gradually from an interface between the mixture layer and the electroconductive oxide layer to an interface between the mixture layer and the electroconductive metal layer.

2. The piezoelectric element according to claim 1, wherein the electroconductive metal is a Pt group metal.

3. The piezoelectric element according to claim 1, wherein a thickness of the mixture layer is not smaller than 10 nm and not larger than 1 μm.

4. The piezoelectric element according to claim 1, wherein concentration of the electroconductive oxide is reduced gradually from the substrate side to the piezoelectric film side of the electrode.

5. The piezoelectric element according to claim 1, wherein a thickness of the piezoelectric film is not smaller than 1 mm and not greater than 200 μm.

6. The piezoelectric element according to claim 1, wherein the electroconductive oxide is an $ABO_3$ perovskite-type oxide.

7. The piezoelectric element according to claim 6, wherein the electroconductive oxide is at least one selected from the group including $LaNiO_3$, $LaCrO_3$, $SrRuO_3$, $CaRuO_3$, $La_{1-x}Sr_xCoO_3$, $BaPbO_3$, $La_{1-x}Sr_xCa_xRuO_3$, $La_{1-x}Sr_xTiO_3$ and $SrIrO_3$, and compounds thereof.

8. The piezoelectric element according to claim 1, wherein the piezoelectric film is one of a lead zirconate titanate-based oxide and a relaxor-based dielectric material.

9. The piezoelectric element according to claim 8, wherein a main component of the lead zirconate titanate-based oxide is represented by $Pb(Zr_y, Ti_{1-y})O_3$, where y is in the range of 0.2 to 0.8.

10. The piezoelectric element according to claim 8, wherein the relaxor-based dielectric material is at least one type selected from the group including $Pb(Mn, Nb)O_3$—$PbTiO_3$, $Pb(Zn, Nb)O_3$—$PbTiO_3$, $Pb(Sc, Ta)O_3$—$PbTiO_3$, $Pb(In, Nb)O_3$—$PbTiO_3$, $Pb(Yb, Nb)O_3$—$PbTiO_3$, $Pb(Ni, Nb)O_3$—$PbTiO_3$, and compounds thereof.

11. An electronic device, comprising the piezoelectric element according to claim 1.

12. An ink jet device, comprising the piezoelectric element according to claim 1.

* * * * *